(12) United States Patent
Kobayashi (10) Patent No.: US 11,201,220 B2
(45) Date of Patent: Dec. 14, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hitoshi Kobayashi, Yamato Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/017,777

(22) Filed: Sep. 11, 2020

(65) Prior Publication Data

US 2021/0257468 A1  Aug. 19, 2021

(30) Foreign Application Priority Data

Feb. 14, 2020 (JP) .............................. JP2020-023030

(51) Int. Cl.
*H01L 29/778* (2006.01)
*H01L 29/417* (2006.01)

(52) U.S. Cl.
CPC .... *H01L 29/41758* (2013.01); *H01L 29/7786* (2013.01)

(58) Field of Classification Search
CPC ......... H01L 29/66431; H01L 29/66462; H01L 29/778–7789; H01L 29/41758
See application file for complete search history.

(56) References Cited

U.S. PATENT DOCUMENTS

| | | | |
|---|---|---|---|
| 8,872,233 B2 * | 10/2014 | Lim ...................... | H01L 29/778 257/194 |
| 2012/0187451 A1 * | 7/2012 | Saito ................... | H01L 29/0623 257/192 |

(Continued)

FOREIGN PATENT DOCUMENTS

| JP | 2007-305954 A | 11/2007 |
|---|---|---|
| JP | 5529595 B | 6/2014 |
| JP | 5596495 B2 | 9/2014 |

*Primary Examiner* — Eric A. Ward
(74) *Attorney, Agent, or Firm* — Allen & Overy LLP (57) ABSTRACT

A semiconductor device includes a first nitride semiconductor layer; a second nitride semiconductor layer provided on the first nitride semiconductor layer and having a bandgap larger than a bandgap of the first nitride semiconductor layer; a nitride insulating layer provided between the first nitride semiconductor layer and the second nitride semiconductor layer; a plurality of first drain electrodes each having a part provided on the nitride insulating layer and a part provided beneath the nitride insulating layer; a plurality of second drain electrodes each having a part provided on the nitride insulating layer and a part provided beneath the nitride insulating layer; a plurality of third drain electrodes each having a part provided on the nitride insulating layer and a part provided beneath the nitride insulating layer; a plurality of fourth drain electrodes each having a part provided on the nitride insulating layer and a part provided beneath the nitride insulating layer; a plurality of first source electrodes provided between the first drain electrodes and the third drain electrodes, the first source electrodes each having a part provided on the nitride insulating layer and a part provided beneath the nitride insulating layer; and a plurality of second source electrodes provided between the first drain electrodes and the third drain electrodes, the second source electrodes each having a part provided on the (Continued)

nitride insulating layer and a part provided beneath the nitride insulating layer. The first drain electrodes are separated from each other by a first distance in a first direction parallel to an interface between the first nitride semiconductor layer and the nitride insulating layer. The second drain electrodes are separated from each other by a second distance in the first direction and positioned from the first drain electrodes by a third distance in the first direction and positioned from the first drain electrodes by a fourth distance in a second direction intersecting with the first direction and parallel to the interface and electrically connected to the first drain electrodes. The third drain electrodes are separated from each other by a fifth distance in the first direction and separated from the first drain electrodes and the second drain electrodes in the second direction. The fourth drain electrodes are separated from each other by a sixth distance in the first direction and positioned from the third drain electrodes by a seventh distance in the first direction and positioned from the third drain electrodes by an eighth distance in the second direction and separated from the first drain electrodes and the second drain electrodes and electrically connected to the third drain electrodes. The first source electrodes are separated from each other by a ninth distance in the first direction. The second source electrodes are separated from each other by a tenth distance in the first direction and positioned from the first source electrodes by an eleventh distance in the first direction and positioned from the first source electrodes by a twelfth distance in the second direction and electrically connected to the first source electrodes.

17 Claims, 9 Drawing Sheets

(56) References Cited

U.S. PATENT DOCUMENTS

2013/0193486 A1     8/2013   Kinoshita et al.
2018/0138306 A1*   5/2018   Jeon .................. H01L 29/7783

* cited by examiner

SEMICONDUCTOR DEVICE

CROSS-REFERENCE TO RELATED APPLICATION

This application is based upon and claims the benefit of priority from Japanese Patent Application No. 2020-023030, filed on Feb. 14, 2020, the entire contents of which are incorporated herein by reference.

FIELD

Embodiments described herein relate generally to a semiconductor device.

BACKGROUND

Semiconductors including group III nitrides such as gallium nitride (GaN) are expected as materials for next-generation power semiconductor devices. GaN-based semiconductors have a larger bandgap than that of silicon (Si). Accordingly, as compared with Si semiconductor devices, GaN-based semiconductor devices make it possible to achieve power semiconductor devices having small sizes and high breakdown voltages. Furthermore, such features enable reduction in parasitic capacitance. Therefore, it is possible to achieve power semiconductor devices driven at high speed.

DETAILED DESCRIPTION

A semiconductor device according to an embodiment includes: a first nitride semiconductor layer; a second nitride semiconductor layer provided on the first nitride semiconductor layer and having a bandgap larger than a bandgap of the first nitride semiconductor layer; a nitride insulating layer provided between the first nitride semiconductor layer and the second nitride semiconductor layer; a plurality of first drain electrodes each having a part provided on the nitride insulating layer and a part provided beneath the nitride insulating layer; a plurality of second drain electrodes each having a part provided on the nitride insulating layer and a part provided beneath the nitride insulating layer; a plurality of third drain electrodes each having a part provided on the nitride insulating layer and a part provided beneath the nitride insulating layer; a plurality of fourth drain electrodes each having a part provided on the nitride insulating layer and a part provided beneath the nitride insulating layer; a plurality of first source electrodes provided between the first drain electrodes and the third drain electrodes, the first source electrodes each having a part provided on the nitride insulating layer and a part provided beneath the nitride insulating layer; and a plurality of second source electrodes provided between the first drain electrodes and the third drain electrodes, the second source electrodes each having a part provided on the nitride insulating layer and a part provided beneath the nitride insulating layer, in which the first drain electrodes are separated from each other by a first distance in a first direction parallel to an interface between the first nitride semiconductor layer and the nitride insulating layer, the second drain electrodes are separated from each other by a second distance in the first direction and positioned from the first drain electrodes by a third distance in the first direction and positioned from the first drain electrodes by a fourth distance in a second direction intersecting with the first direction and parallel to the interface and electrically connected to the first drain electrodes, the third drain electrodes are separated from each other by a fifth distance in the first direction and separated from the first drain electrodes and the second drain electrodes in the second direction, the fourth drain electrodes are separated from each other by a sixth distance in the first direction and positioned from the third drain electrodes by a seventh distance in the first direction and positioned from the third drain electrodes by an eighth distance in the second direction and separated from the first drain electrodes and the second drain electrodes and electrically connected to the third drain electrodes, the first source electrodes are separated from each other by a ninth distance in the first direction, and the second source electrodes are separated from each other by a tenth distance in the first direction and positioned from the first source electrodes by an eleventh distance in the first direction and positioned from the first source electrodes by a twelfth distance in the second direction and electrically connected to the first source electrodes.

Herein, the term "nitride (GaN-based) semiconductor" is a general term for semiconductors including gallium nitride (GaN), aluminum nitride (AlN), indium nitride (InN), and intermediate compositions of those compounds.

Herein, the term "undoped" indicates that the impurity concentration is $1 \times 10^{15}$ cm$^{-3}$ or less.

Herein, the upper direction of the drawing is described as "up" and the lower direction of the drawing is described as "down" to show the positional relation of components and the like. Herein, the terms "up" and "down" do not necessarily relate to the direction of gravity.

First Embodiment

A semiconductor device according to this embodiment includes: a first nitride semiconductor layer; a second nitride semiconductor layer provided on the first nitride semiconductor layer and having a bandgap larger than a bandgap of the first nitride semiconductor layer; a nitride insulating layer provided between the first nitride semiconductor layer and the second nitride semiconductor layer; a plurality of first drain electrodes each having a part provided on the nitride insulating layer and a part provided beneath the nitride insulating layer; a plurality of second drain electrodes each having a part provided on the nitride insulating layer and a part provided beneath the nitride insulating layer; a plurality of third drain electrodes each having a part provided on the nitride insulating layer and a part provided beneath the nitride insulating layer; a plurality of fourth drain electrodes each having a part provided on the nitride insulating layer and a part provided beneath the nitride insulating layer; a plurality of first source electrodes provided between the first drain electrodes and the third drain electrodes, the first source electrodes each having a part provided on the nitride insulating layer and a part provided beneath the nitride insulating layer; and a plurality of second source electrodes provided between the first drain electrodes and the third drain electrodes, the second source electrodes each having a part provided on the nitride insulating layer and a part provided beneath the nitride insulating layer, in which the first drain electrodes are separated from each other by a first distance in a first direction parallel to an interface between the first nitride semiconductor layer and the nitride insulating layer, the second drain electrodes are separated from each other by a second distance in the first direction and positioned from the first drain electrodes by a third distance in the first direction and positioned from the first drain electrodes by a fourth distance in a second direction intersecting with the first direction and parallel to the interface and electrically connected to the first drain electrodes, the third drain electrodes are separated from each other by a fifth distance in the first direction and separated from the first drain electrodes and the second drain electrodes in the second direction, the fourth drain electrodes are separated from each other by a sixth distance in the first direction and positioned from the third drain electrodes by a seventh distance in the first direction and positioned from the third drain electrodes by an eighth distance in the second direction and separated from the first drain electrodes and the second drain electrodes and electrically connected to the third drain electrodes, the first source electrodes are separated from each other by a ninth distance in the first direction, and the second source electrodes are separated from each other by a tenth distance in the first direction and positioned from the first source electrodes by an eleventh distance in the first direction and positioned from the first source electrodes by a twelfth distance in the second direction and electrically connected to the first source electrodes.

Figure 1A:
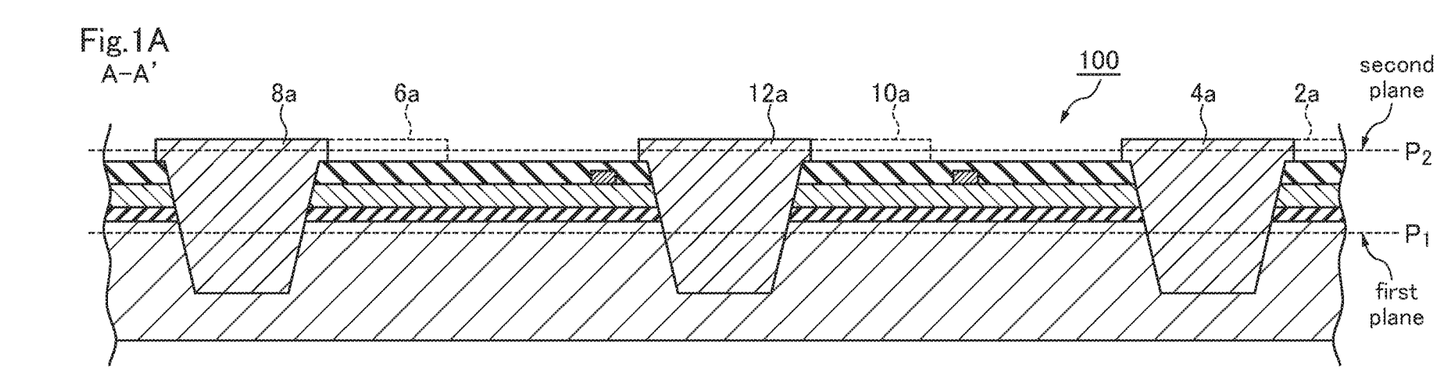
FIGS. 1A and 1B are schematic cross-sectional views of a semiconductor device according to a first embodiment.
Figure 1B:
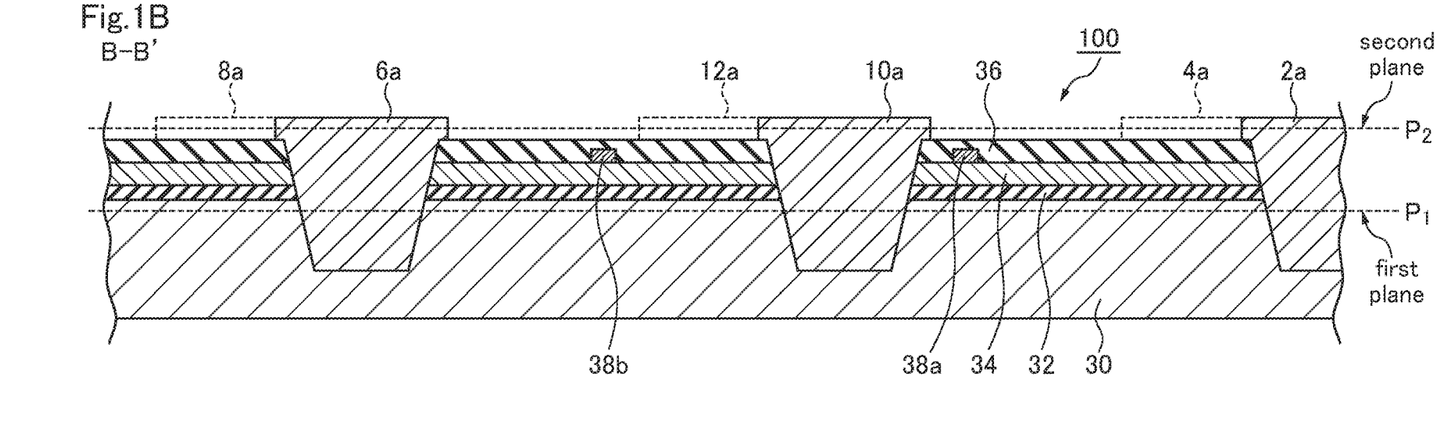
Figure 2:
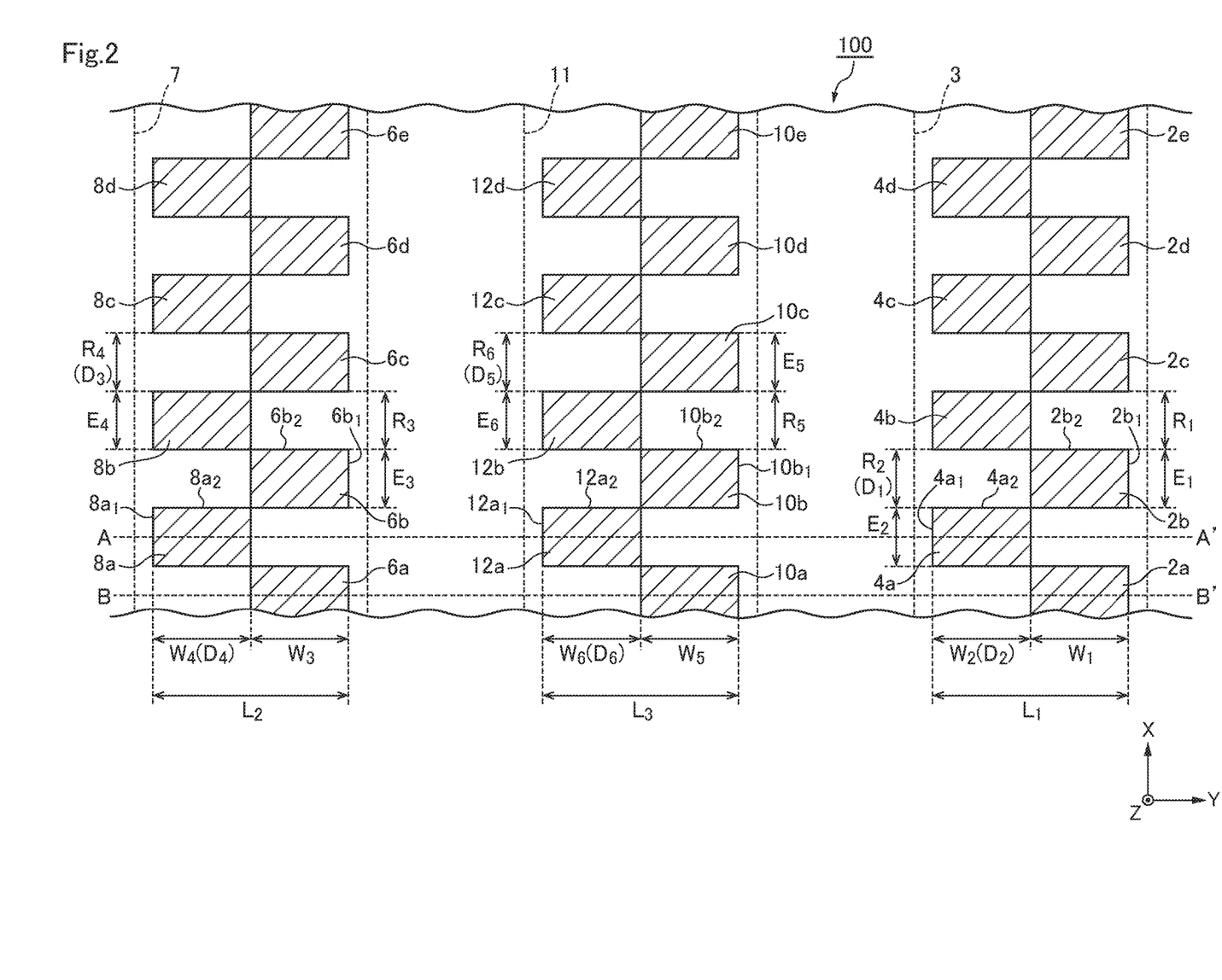
FIG. 2 is a schematic top view of a main section of the semiconductor device according to the first embodiment.
Figure 3:
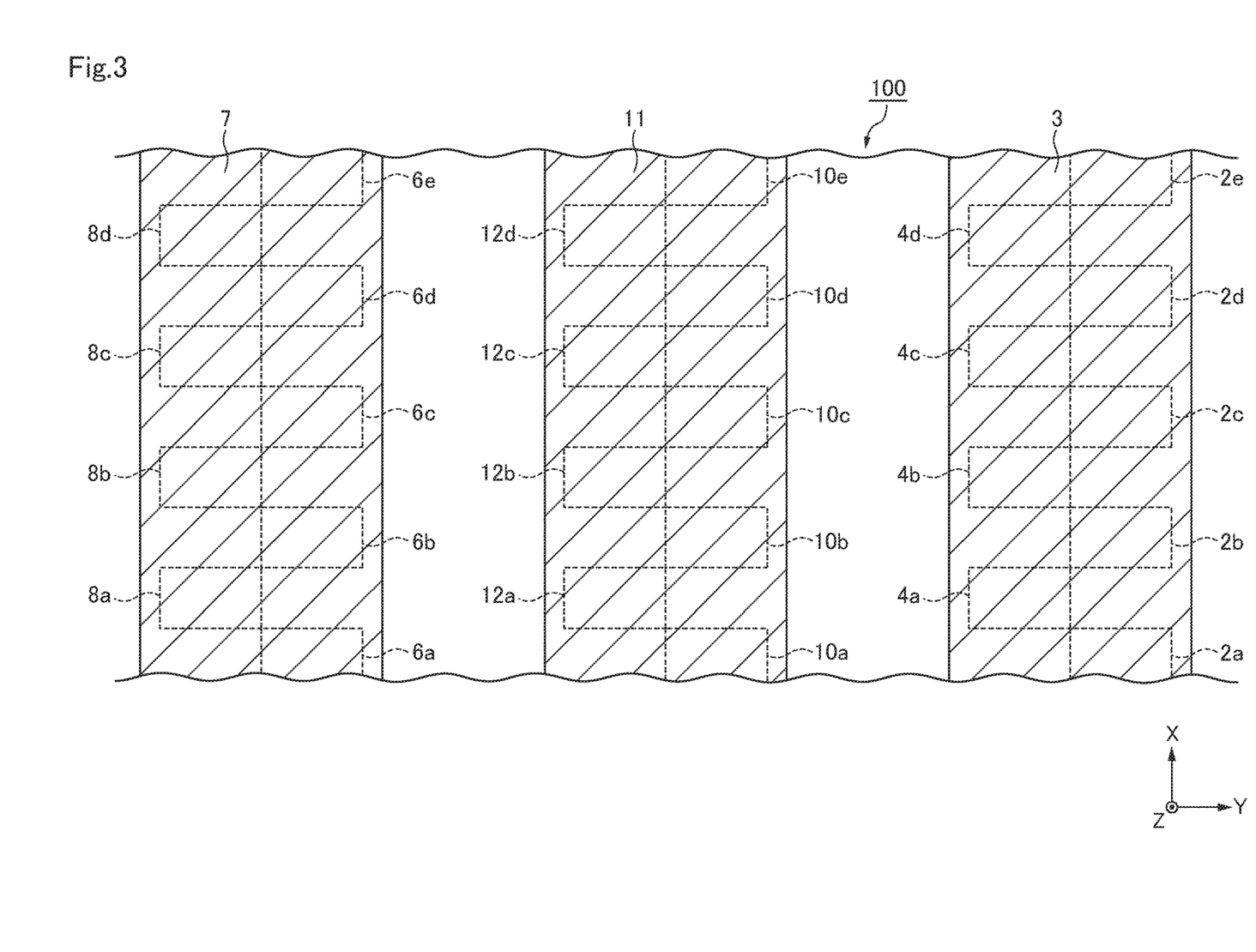
FIG. 3 is a schematic top view of the main section of the semiconductor device according to the first embodiment.

FIGS. 1A and 1B are schematic cross-sectional views of a semiconductor device 100 according to this embodiment. FIGS. 2 and 3 are schematic top views of a main section of the semiconductor device 100 according to this embodiment. The semiconductor device 100 according to this embodiment is a high electron mobility transistor (HEMT) including a nitride semiconductor.

FIG. 1A is a schematic cross-sectional view of the semiconductor device 100 in YZ plane including A-A' line (FIG. 2), Y axis parallel to Y direction, and Z axis parallel to Z direction. FIG. 1B is a schematic cross-sectional view of the semiconductor device 100 in YZ plane including B-B' line (FIG. 2).

FIG. 2 is a schematic cross-sectional view of the main section of the semiconductor device 100, illustrating a plurality of first drain electrodes 2, a plurality of second drain electrodes 4, a plurality of third drain electrodes 6, a plurality of fourth drain electrodes 8, a plurality of first source electrodes 10, and a plurality of second source electrodes 12 in a first plane $P_1$ (FIGS. 1A and 1B). The first plane $P_1$ is provided beneath an interface between a first nitride semiconductor layer 30 and a first nitride insulating layer 32 and is parallel to the interface between the first nitride semiconductor layer 30 and the first nitride insulating layer 32. The first plane $P_1$ is, for example, a heterojunction interface provided with a two-dimensional electron gas (2DEG), but it is a matter of course that the first plane $P_1$ is not limited thereto. The first plane $P_1$ is an example of the predetermined plane.

In this embodiment, X direction, Y direction perpendicular to X direction, and Z direction perpendicular to X direction and Y direction are defined. In Z direction, the first nitride semiconductor layer 30, a second nitride semiconductor layer 34, and the first nitride insulating layer 32 are laminated. The first nitride semiconductor layer 30, the second nitride semiconductor layer 34, the first nitride insulating layer 32, and a second nitride insulating layer 36 are parallel to a plane including X axis parallel to X direction and Y axis parallel to Y direction, that is, XY plane. In addition, the interface between the first nitride semiconductor layer 30 and the first nitride insulating layer 32, an interface between the first nitride insulating layer 32 and the second nitride semiconductor layer 34, and an interface between the second nitride semiconductor layer 34 and the second nitride insulating layer 36 are parallel to XY plane. X direction is an example of the first direction, and Y direction is an example of the second direction.

The first nitride semiconductor layer 30 is, for example, undoped $Al_xGa_{1-x}N$ ($0 \leq X < 1$). More specifically, the first nitride semiconductor layer 30 is, for example, undoped GaN. The first nitride semiconductor layer 30 has a thickness of, for example, 0.2 µm or more and 3 µm or less.

The second nitride semiconductor layer 34 is provided on the first nitride semiconductor layer 30. The second nitride semiconductor layer 34 has a bandgap larger than that of the first nitride semiconductor layer 30. The second nitride semiconductor layer 34 is, for example, undoped $Al_yGa_{1-y}N$ ($0 < Y \leq 1$, $X < Y$). More specifically, the second nitride semiconductor layer 34 is, for example, undoped $Al_{0.2}Ga_{0.8}N$. The second nitride semiconductor layer 34 has a thickness of, for example, 15 nm or more and 50 nm or less.

The first nitride insulating layer 32 is provided between the first nitride semiconductor layer 30 and the second nitride semiconductor layer 34. The first nitride insulating layer 32 includes, for example, aluminum nitride (AlN). The first nitride insulating layer 32 has a thickness of, for example, 0.2 nm or more and 10 nm or less. The first nitride insulating layer 32 is an example of the nitride insulating layer.

The second nitride insulating layer 36 is provided on the second nitride semiconductor layer 34. The second nitride insulating layer 36 includes, for example, silicon nitride (SiN). The second nitride insulating layer 36 is used, for example, as a mask material in a manufacturing process of the semiconductor device 100.

FIG. 3 is a schematic cross-sectional view of the main section of the semiconductor device 100, illustrating the first drain electrodes 2, the second drain electrodes 4, the third drain electrodes 6, the fourth drain electrodes 8, the first source electrodes 10, the second source electrodes 12, a first upper electrode 3, a second upper electrode 7, and a third upper electrode 11 in a second plane $P_2$ (FIGS. 1A and 1B). The second plane $P_2$ is provided above the interface between the first nitride semiconductor layer 30 and the first nitride insulating layer 32 and is parallel to the interface between the first nitride semiconductor layer 30 and the first nitride insulating layer 32.

The first drain electrodes 2 each have a part provided on the first nitride insulating layer 32 and a part provided beneath the first nitride insulating layer 32. The first drain electrodes 2 are separated from each other by $R_1$ (an example of the first distance) in X direction in the first plane $P_1$. In FIGS. 2 and 3, first drain electrodes 2a, 2b, 2c, 2d, and 2e are provided as the first drain electrodes 2. For example, $R_1$ corresponds to a distance between the first drain electrodes 2a, 2b, 2c, 2d and 2e. For example, $R_1$ corresponds to a shorter width of the second drain electrodes 4a, 4b, 4c, and 4d.

The first drain electrodes 2 in the first plane $P_1$ have a rectangular shape. For example, a first side $2b_1$ of the first drain electrode 2b in the first plane $P_1$ is parallel to X axis, and a second side $2b_2$ in the first plane $P_1$ is parallel to Y axis. The length of the first side $2b_1$ is $E_1$. Although $E_1=R_1$ in this embodiment, $E_1$ and $R_1$ may be different. The length of the second side $2b_2$ is $W_1$. For example, $W_1$ corresponds a longer width of the first drain electrodes 2a, 2b, 2c, 2d, and 2e. The other first drain electrodes 2a, 2c, 2d and 2e are similar to the first drain electrode 2b. The first drain electrodes 2 are not limited to a rectangular shape.

The second drain electrodes 4 each have a part provided on the first nitride insulating layer 32 and a part provided beneath the first nitride insulating layer 32. The second drain electrodes 4 are separated from each other by $R_2$ (an example of the second distance) in X direction in the first plane $P_1$. For example, $R_2$ corresponds to a distance between the second drain electrodes 4a, 4b, 4c and 4d. For example, $R_2$ corresponds to a shorter width of the first drain electrodes 2a, 2b, 2c, 2d, and 2e. Although $R_1=R_2$ in this embodiment, $R_1$ and $R_2$ may be different. In FIGS. 2 and 3, second drain electrodes 4a, 4b, 4c and 4d are provided as the second drain electrodes 4.

The second drain electrodes 4 in the first plane $P_1$ have a rectangular shape. For example, a third side $4a_1$ of the second drain electrode 4a in the first plane $P_1$ is parallel to X axis, and a fourth side $4a_2$ in the first plane $P_1$ is parallel to Y axis. The length of the third side $4a_1$ is $E_2$. Although $E_1=E_2$ in this embodiment, $E_1$ and $E_2$ may be different. The length of the fourth side $4a_2$ is $W_2$. For example, $W_2$ corresponds to a longer width of the second drain electrodes 4a, 4b, 4c, and 4d. Although $W_1=W_2$ in this embodiment, $W_1$ and $W_2$ may be different. The other second drain electrodes 4b, 4c and 4d are similar to the second drain electrode 4a. The second drain electrodes 4 are not limited to a rectangular shape.

The second drain electrodes 4 are positioned from the first drain electrodes by $D_1$ (an example of the third distance) in X direction in the first plane $P_1$. The second drain electrodes 4 are positioned from the first drain electrodes 2 by $D_2$ (an example of the fourth distance) in Y direction. Although $D_1=R_2$ in this embodiment, $D_1$ and $R_2$ may be different. Furthermore, $D_2=W_2$ in this embodiment, but $D_2$ and $W_2$ may be different.

The third drain electrodes 6 each have a part provided on the first nitride insulating layer 32 and a part provided beneath the first nitride insulating layer 32. The third drain electrodes 6 are separated from each other by $R_3$ (an example of the fifth distance) in X direction in the first plane $P_1$. For example, $R_3$ corresponds to a distance between the third drain electrodes 6a, 6b, 6c, 6d and 6e. For example, $R_3$ corresponds to a shorter width of the fourth drain electrodes 8a, 8b, 8c, and 8d. Although $R_1=R_3$ in this embodiment, $R_1$ and $R_3$ may be different. Furthermore, the third drain electrodes 6 are separated from the first drain electrodes 2 and the second drain electrodes 4 in Y direction. In FIGS. 2 and 3, third drain electrodes 6a, 6b, 6c, 6d, and 6e are provided as the third drain electrodes 6.

The third drain electrodes 6 in the first plane $P_1$ have a rectangular shape. For example, a fifth side $6b_1$ of the third drain electrode 6b in the first plane $P_1$ is parallel to X axis, and a sixth side $6b_2$ in the first plane $P_1$ is parallel to Y axis. The length of the fifth side $6b_1$ is $E_3$. Although $E_1=E_3$ in this embodiment, $E_1$ and $E_3$ may be different. The length of the sixth side $6b_2$ is $W_3$. For example, $W_3$ corresponds to a longer width of the third drain electrodes 6a, 6b, 6c, 6d, and 6e. Although $W_1=W_3$ in this embodiment, $W_1$ and $W_3$ may be different. The other third drain electrodes 6a, 6c, 6d, and 6e are similar to the third drain electrode 6b. The third drain electrodes 6 are not limited to a rectangular shape.

The fourth drain electrodes 8 each have a part provided on the first nitride insulating layer 32 and a part provided beneath the first nitride insulating layer 32. The fourth drain electrodes 8 are separated from each other by $R_4$ (an example of the sixth distance) in X direction in the first plane $P_1$. For example, $R_4$ corresponds to a distance between the fourth drain electrodes 8a, 8b, 8c and 8d. For example, $R_4$ corresponds to a shorter width of the third drain electrodes 6a, 6b, 6c, 6d, and 6e. Although $R_1=R_4$ in this embodiment, $R_1$ and $R_4$ may be different. FIGS. 2 and 3, fourth drain electrodes 8a, 8b, 8c and 8d are provided as the fourth drain electrodes 8. The second drain electrodes 4 and the third drain electrodes 6 are positioned between the first drain electrodes 2 and the fourth drain electrodes 8.

The fourth drain electrodes 8 in the first plane $P_1$ have a rectangular shape. For example, a seventh side $8a_1$ of the fourth drain electrode 8a in the first plane $P_1$ is parallel to X axis, and an eighth side $8a_2$ in the first plane $P_1$ is parallel to Y axis. The length of the seventh side $8a_1$ is $E_4$. Although $E_1=E_4$ in this embodiment, $E_1$ and $E_4$ may be different. The length of the eighth side $8a_2$ is $W_4$. For example, $W_4$ corresponds a longer width of the fourth drain electrodes 8a, 8b, 8c, and 8d. Although $W_1=W_4$ in this embodiment, $W_1$ and $W_4$ may be different. The other fourth drain electrodes 8b, 8c, and 8d are similar to the fourth drain electrode 8a. The fourth drain electrodes 8 are not limited to a rectangular shape.

The fourth drain electrodes 8 are positioned from the third drain electrodes by $D_3$ (an example of the seventh distance) in X direction in the first plane $P_1$. The fourth drain electrodes 8 are positioned from the third drain electrodes 6 by $D_4$ (an example of the eighth distance) in Y direction. Although $D_1=D_3$ in this embodiment, $D_1$ and $D_3$ may be different. Furthermore, $D_2=D_4$ in this embodiment, but $D_2$ and $D_4$ may be different.

The first source electrodes 10 are provided between the first drain electrodes 2 and the third drain electrodes 6. The first source electrodes 10 each have a part provided on the first nitride insulating layer 32 and a part provided beneath the first nitride insulating layer 32. The first source electrodes 10 are separated from each other by $R_5$ (an example of the ninth distance) in X direction in the first plane $P_1$. For example, $R_5$ corresponds to a distance between the first source electrodes 10a, 10b, 10c, 10d and 10e. For example, $R_5$ corresponds to a shorter width of the second source electrodes 12a, 12b, 12c, and 12d. Although $R_1=R_5$ in this embodiment, $R_1$ and $R_5$ may be different. FIGS. 2 and 3, first source electrodes 10a, 10b, 10c, 10d and 10e are provided as the first source electrodes 10.

The first source electrodes 10 in the first plane $P_1$ have a rectangular shape. For example, a ninth side $10b_1$ of the first source electrode 10b in the first plane $P_1$ is parallel to X axis, and a tenth side $10b_2$ in the first plane $P_1$ is parallel to Y axis. The length of the ninth side $10b_1$ is $E_5$. Although $E_1=E_5$ in this embodiment, $E_1$ and $E_5$ may be different. The length of the tenth side $10b_2$ is $W_5$. For example, $W_5$ corresponds to a longer width of the first source electrodes $10a$, $10b$, $10c$, $10d$, and $10e$. Although $W_1=W_5$ in this embodiment, $W_1$ and $W_5$ may be different. The other first source electrodes $10a$, $10c$, $10d$, and $10e$ are similar to the first source electrode $10b$. The first source electrodes 10 are not limited to a rectangular shape.

The second source electrodes 12 are provided between the first drain electrodes 2 and the third drain electrodes 6. The second source electrodes 12 each have a part provided on the first nitride insulating layer 32 and a part provided beneath the first nitride insulating layer 32. The second source electrodes 12 are separated from each other by $R_6$ (an example of the tenth distance) in X direction in the first plane $P_1$. For example, $R_6$ corresponds to a distance between the second source electrodes $12a$, $12b$, $12c$ and $12d$. For example, $R_6$ corresponds to a shorter width of the first source electrodes $10a$, $10b$, $10c$, $10d$, and $10e$. Although $R_1=R_6$ in this embodiment, $R_1$ and $R_6$ may be different. FIGS. 2 and 3, second source electrodes $12a$, $12b$, $12c$, $12d$ and $12e$ are provided as the second source electrodes 12.

The second source electrodes 12 in the first plane $P_1$ have a rectangular shape. For example, an eleventh side $12a_1$ of the second source electrode $12a$ in the first plane $P_1$ is parallel to X axis, and a twelfth side $12a_2$ in the first plane $P_1$ is parallel to Y axis. The length of the eleventh side $12a_1$ is $E_6$. Although $E_1=E_6$ in this embodiment, $E_1$ and $E_6$ may be different. The length of the twelfth side $12a_2$ is $W_6$. For example, $W_6$ corresponds to a longer width of the second source electrodes $12a$, $12b$, $12c$, and $12d$. Although $W_1=W_6$ in this embodiment, $W_1$ and $W_6$ may be different. The other second source electrodes $12b$, $12c$, and $12d$ are similar to the second source electrode $12a$. The second source electrodes 12 are not limited to a rectangular shape.

The second source electrodes 12 are positioned from the first source electrodes 10 by $D_5$ (an example of the eleventh distance) in X direction in the first plane $P_1$. The second source electrodes 12 are positioned from the first source electrodes 10 by $D_6$ (an example of the twelfth distance) in Y direction. Although $D_1=D_5$ in this embodiment, $D_1$ and $D_5$ may be different. Furthermore, $D_2=D_6$ in this embodiment, but $D_2$ and $D_6$ may be different. The first source electrodes 10 and the second source electrodes 12 are positioned between the second drain electrodes 4 and the third drain electrodes 6.

The first upper electrode 3 is provided on the first drain electrodes 2 and the second drain electrodes 4. The first upper electrode 3 electrically connects the first drain electrodes 2 and the second drain electrodes 4. Accordingly, the first drain electrodes 2 and the second drain electrodes 4 are electrically connected to each other.

For example, the first upper electrode 3, the first drain electrodes 2, and the second drain electrodes 4 are formed in an integrated manner but are not limited to the configuration.

The second upper electrode 7 is provided on the third drain electrodes 6 and the fourth drain electrodes 8. The second upper electrode 7 electrically connects the third drain electrodes 6 and the fourth drain electrodes 8. Accordingly, the third drain electrodes 6 and the fourth drain electrodes 8 are electrically connected to each other. For example, the second upper electrode 7, the third drain electrodes 6, and the fourth drain electrodes 8 are formed in an integrated manner but are not limited to the configuration.

The third upper electrode 11 is provided on the first source electrodes 10 and the second source electrodes 12. The third upper electrode 11 electrically connects the first source electrodes 10 and the second source electrodes 12. Accordingly, the first source electrodes 10 and the second source electrodes 12 are electrically connected to each other. For example, the third upper electrode 11, the first source electrodes 10 and the second source electrodes 12 are formed in an integrated manner but are not limited to the configuration.

Note that a gate electrode $38a$ and a gate electrode $38b$ are provided (FIGS. 1A and 1B).

The first drain electrodes 2, the second drain electrodes 4, the third drain electrodes 6, the fourth drain electrodes 8, the first source electrodes 10, the second source electrodes 12, the first upper electrode 3, the second upper electrode 7, and the third upper electrode 11 are, for example, metal electrodes. The first drain electrodes 2, the second drain electrodes 4, the third drain electrodes 6, the fourth drain electrodes 8, the first source electrodes 10, the second source electrodes 12, the first upper electrode 3, the second upper electrode 7, and the third upper electrode 11 have, for example, a laminated structure of titanium (Ti) and aluminum (Al) or a laminated structure of nickel (Ni) and gold (Au).

Figure 4A:
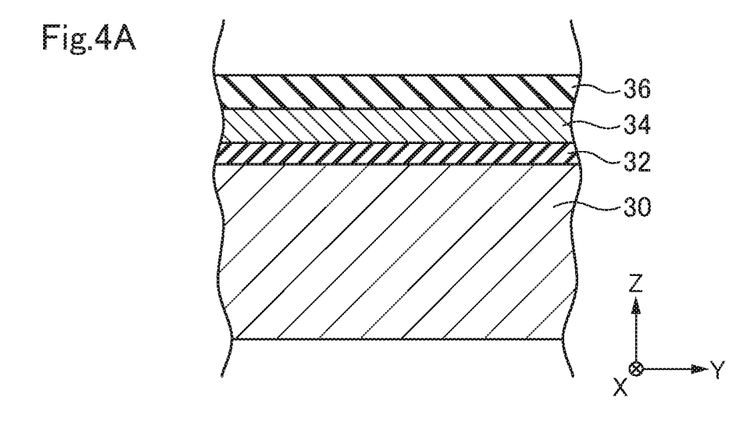
FIGS. 4A to 4C are schematic cross-sectional views illustrating a manufacturing process of the main section of the semiconductor device according to the first embodiment.
Figure 4B:
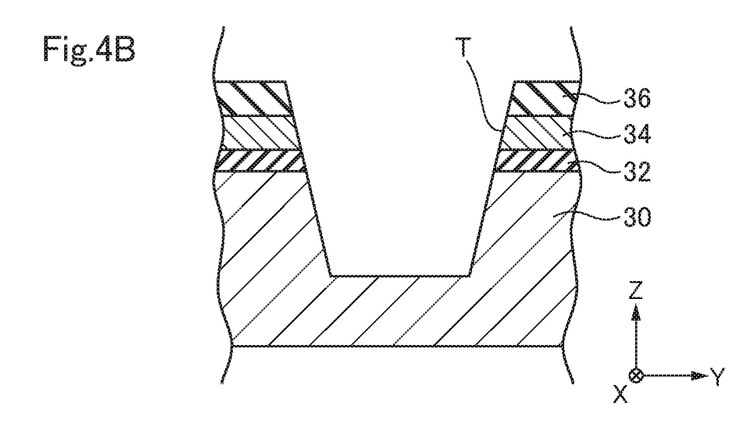
Figure 4C:
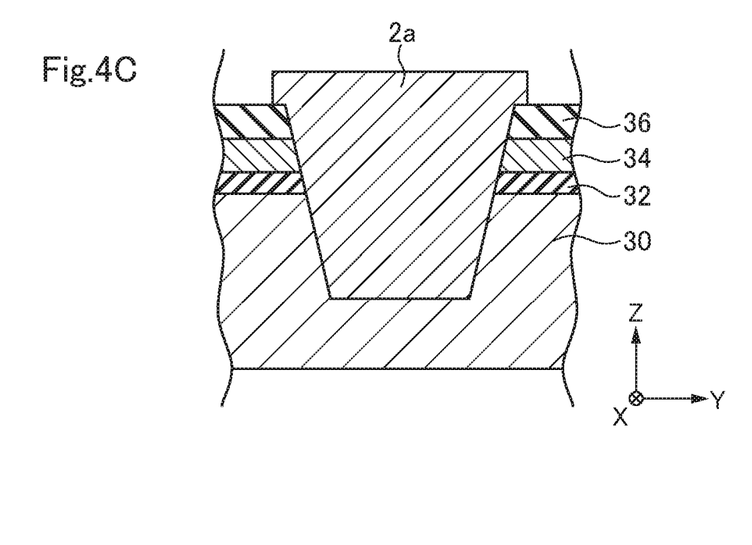

FIGS. 4A to 4C are schematic cross-sectional views illustrating a manufacturing process of the main section of the semiconductor device 100 according to this embodiment.

The first step is to form the first nitride semiconductor layer 30 containing undoped GaN or the like. Next, the first nitride insulating layer 32 containing AlN or the like is formed on the first nitride semiconductor layer 30. Next, the second nitride semiconductor layer 34 containing AlGaN or the like is formed on the first nitride insulating layer 32. Next, the second nitride insulating layer 36 containing SiN or the like is formed on the second nitride semiconductor layer 34 (FIG. 4A).

Next, using the second nitride insulating layer 36 as a mask material, a trench T is formed (FIG. 4B). The trench T penetrates through the first nitride insulating layer 32, the second nitride semiconductor layer 34, and the second nitride insulating layer 36 and has a bottom in the first nitride semiconductor layer 30.

Next, the first drain electrode $2a$ is formed inside the trench T (FIG. 4C).

Note that the first drain electrodes 2, the second drain electrodes 4, the third drain electrodes 6, the fourth drain electrodes 8, the first source electrodes 10 and the second source electrodes 12 are manufactured in a similar manner to the above process.

Hereinafter is described function effects of the semiconductor device 100 according to this embodiment.

To reduce on-resistance, those skilled in the art have been studying on a structure in which the first nitride insulating layer 32 containing AlN or the like is provided between the first nitride semiconductor layer 30 and the second nitride semiconductor layer 34. The first nitride insulating layer 32 enables an increase in carrier mobility. However, the first nitride insulating layer 32 contains an insulating material such as AlN. Here, it is considered that a two-dimensional electron gas (2DEG) is formed in the first nitride semiconductor layer 30 beneath the first nitride insulating layer 32. Therefore, in the structure including the first nitride insulating layer 32, it is difficult to electrically connect an electrode on the first nitride insulating layer 32 and the 2DEG.

Accordingly, the semiconductor device 100 of this embodiment includes the first drain electrodes 2 each of which has a part provided on the first nitride insulating layer 32 and a part provided beneath the first nitride insulating layer 32 and which are separated from each other by $R_1$ in X direction, and the semiconductor device 100 includes the second drain electrodes 4 each of which has a part provided on the first nitride insulating layer 32 and a part provided beneath the first nitride insulating layer 32 and which are separated from each other by $R_2$ in X direction and positioned from the first drain electrodes 2 by $D_1$ in X direction and positioned from the first drain electrodes 2 by $D_2$ in Y direction and electrically connected to the first drain electrodes 2.

The first drain electrodes 2 and the second drain electrodes 4 both have a part provided on the first nitride insulating layer 32 and a part provided beneath the first nitride insulating layer 32. Such a configuration enables an electrical connection to the 2DEG.

Figure 5:
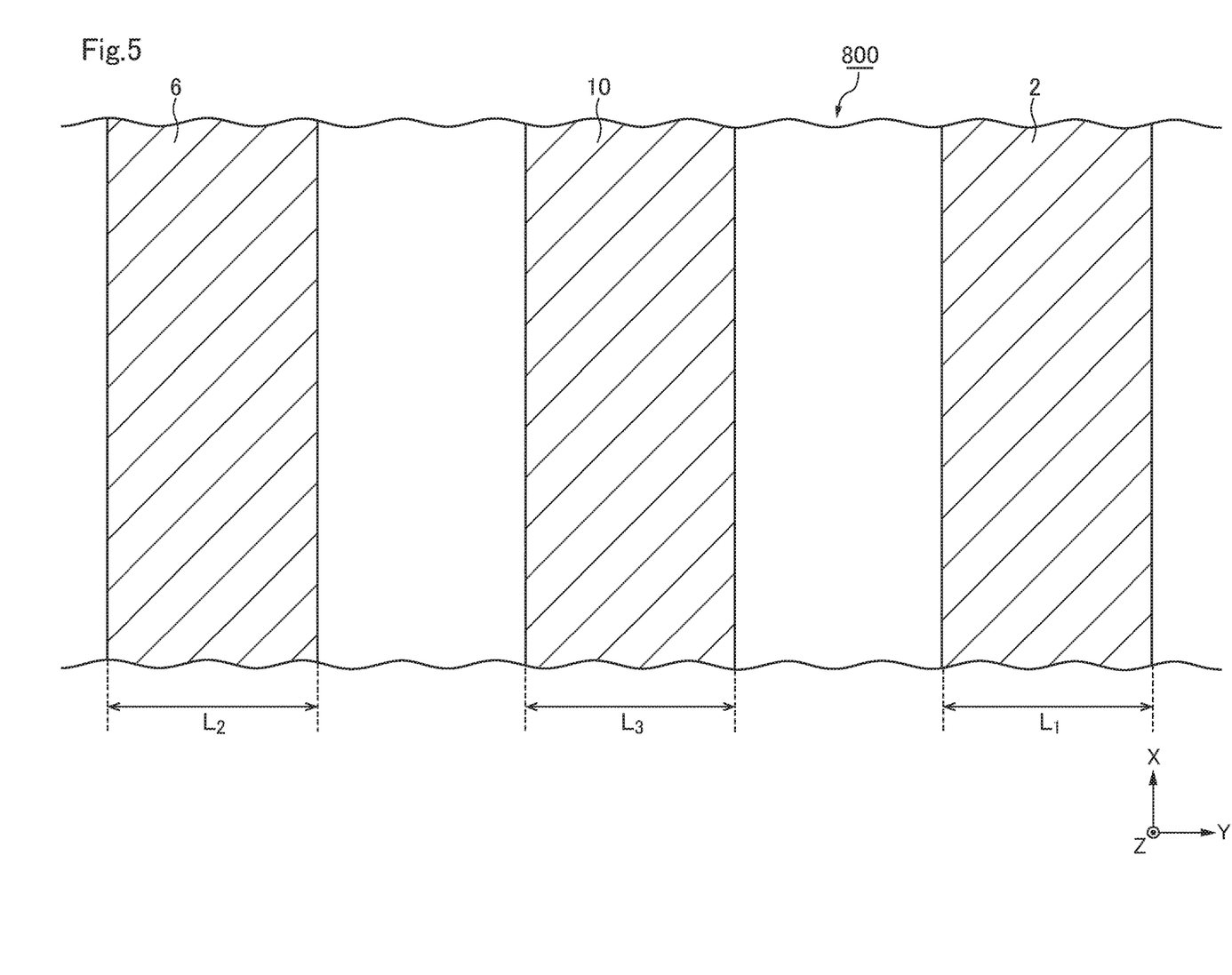
FIG. 5 is a schematic top view of a main section of a semiconductor device illustrated as a comparative example of the first embodiment.

FIG. 5 is a schematic cross-sectional view of a main section of a semiconductor device 800 illustrated as a comparative example of this embodiment. FIG. 5 is a sectional view on the first plane $P_1$. In the semiconductor device 800, first drain electrodes 2, third drain electrodes 6, and first source electrodes 10 each have an integral structure.

As compared with the semiconductor device 800, the semiconductor device 100 according to this embodiment is provided with the second drain electrodes 4. The second drain electrodes 4 are positioned from the first drain electrodes 2 by $D_2$ in Y direction. Accordingly, as compared with the semiconductor device 800 in regard to one of the second drain electrodes 4, a portion where the drain electrode is in contact with the 2DEG in the first plane $P_1$ is increased by, for example, $2 \times D_2$. Such a configuration makes it possible to provide a low-resistance semiconductor device.

Furthermore, for example, a length of a portion where the first drain electrodes 2 and the second drain electrodes 4 are in contact with each other on the first plane $P_1$ is "$2 \times W_2 \times N_2 + E_2 \times N_2 + E_1 \times N_1$" where $N_1$ represents the number of the first drain electrodes 2 and $N_2$ represents the number of the second drain electrodes 4. In this expression, a value of "$2 \times W_2 \times N_2$" is considered to be an increase in length due to a shift of the second drain electrodes 4 from the first drain electrodes 2 by $D_2$ in Y direction. Due to such an increase in contact length, it is possible to provide a low-resistance semiconductor device.

The first drain electrodes 2 have a rectangular shape having the first side parallel to X direction and the second side parallel to Y direction, and the second drain electrodes 4 have a rectangular shape having the third side parallel to X direction and the fourth side parallel to Y direction. Furthermore, the length $E_1$ of the first side, the length $E_2$ of the third side, the first distance $R_1$, the second distance $R_2$, and the third distance $D_1$ are all equal to each other. With such a simple repetitive structure, it is possible to provide an easily manufactured low-resistance semiconductor device.

Similarly, it is possible to provide a low-resistance semiconductor device with a structure including the third drain electrodes 6 each of which has a part provided on the first nitride insulating layer 32 and a part provided beneath the first nitride insulating layer 32 and which are separated from each other by $R_3$ in X direction and including the fourth drain electrodes 8 each of which has a part provided on the first nitride insulating layer 32 and a part provided beneath the first nitride insulating layer 32 and which are separated from each other by $R_4$ in X direction and positioned from the third drain electrodes 6 by $D_3$ in X direction and positioned from the third drain electrodes 6 by $D_4$ in Y direction and electrically connected to the third drain electrodes 6.

Similarly, the third drain electrodes 6 have a rectangular shape having the fifth side parallel to X direction and the sixth side parallel to Y direction, and the fourth drain electrodes 8 has a rectangular shape having the seventh side parallel to X direction and the eighth side parallel to Y direction. Furthermore, the length $E_3$ of the fifth side, the length $E_4$ of the seventh side, the fifth distance $R_3$, the sixth distance $R_4$, and the seventh distance $D_3$ are all equal to each other. With such a simple repetitive structure, it is possible to provide a low-resistance semiconductor device that is easy to manufacture.

Similarly, it is possible to provide a low-resistance semiconductor device with a structure including the first source electrodes 10 each of which has a part provided on the first nitride insulating layer 32 and a part provided beneath the first nitride insulating layer 32 and which are separated from each other by $R_5$ in X direction and including the second source electrodes 12 each of which has a part provided on the first nitride insulating layer 32 and a part provided beneath the first nitride insulating layer 32 and which are separated from each other by $R_6$ in X direction and positioned from the first source electrodes 10 by $D_5$ in X direction and positioned from the first source electrodes 10 by $D_6$ in Y direction and electrically connected to the first source electrodes 10.

Similarly, the first source electrodes 10 have a rectangular shape having the ninth side parallel to X direction and the tenth side parallel to Y direction, and the second source electrodes 12 have a rectangular shape having the eleventh side parallel to X direction and the twelfth side parallel to Y direction. Furthermore, the length $E_5$ of the ninth side, the length $E_6$ of the eleventh side, the ninth distance $R_5$, the tenth distance $R_6$, and the eleventh distance $D_5$ are all equal to each other. With such a simple repetitive structure, it is possible to provide an easily manufactured low-resistance semiconductor device.

According to the semiconductor device 100 of this embodiment, it is possible to provide a low-resistance semiconductor device.

Second Embodiment

A semiconductor device of this embodiment is different from the semiconductor device in the first embodiment in that $E_1$ is smaller than $R_1$, $D_1$ is smaller than $R_1$, $E_2$ is smaller than $R_2$, $E_3$ is smaller than $R_3$, $D_3$ is smaller than $R_3$, $E_4$ is smaller than $R_4$, $E_5$ is smaller than $R_5$, $D_5$ is smaller than $R_5$, and $E_6$ is smaller than $R_6$. Here, those different from the first embodiment will not be described.

Figure 6:
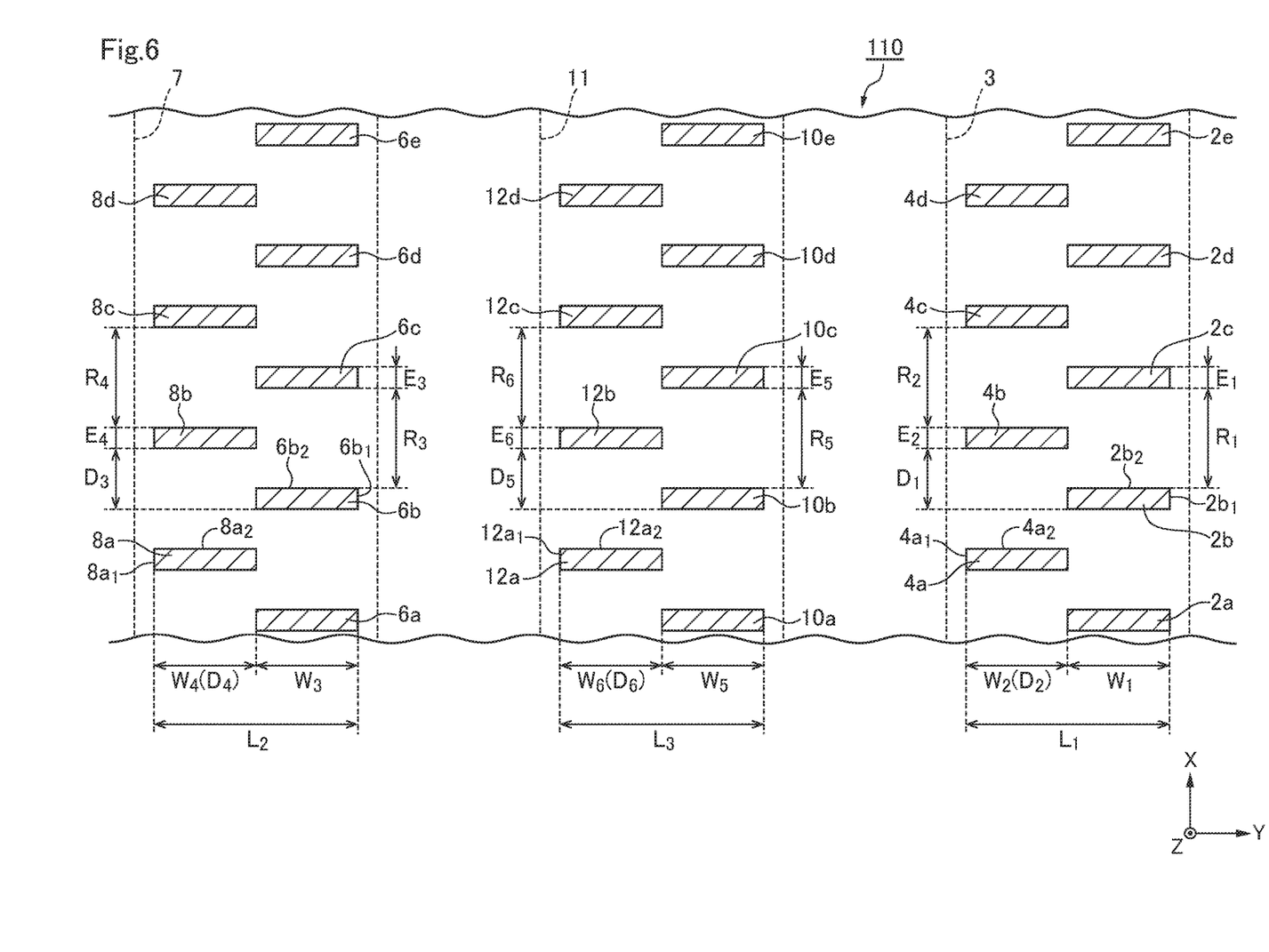
FIG. 6 is a schematic top view of a main section of a semiconductor device according to a second embodiment.

FIG. 6 is a schematic cross-sectional view of a main section of a semiconductor device 110 according to this embodiment. The semiconductor device according to this embodiment also enables a low-resistance semiconductor device to be achieved.

Figure 7:
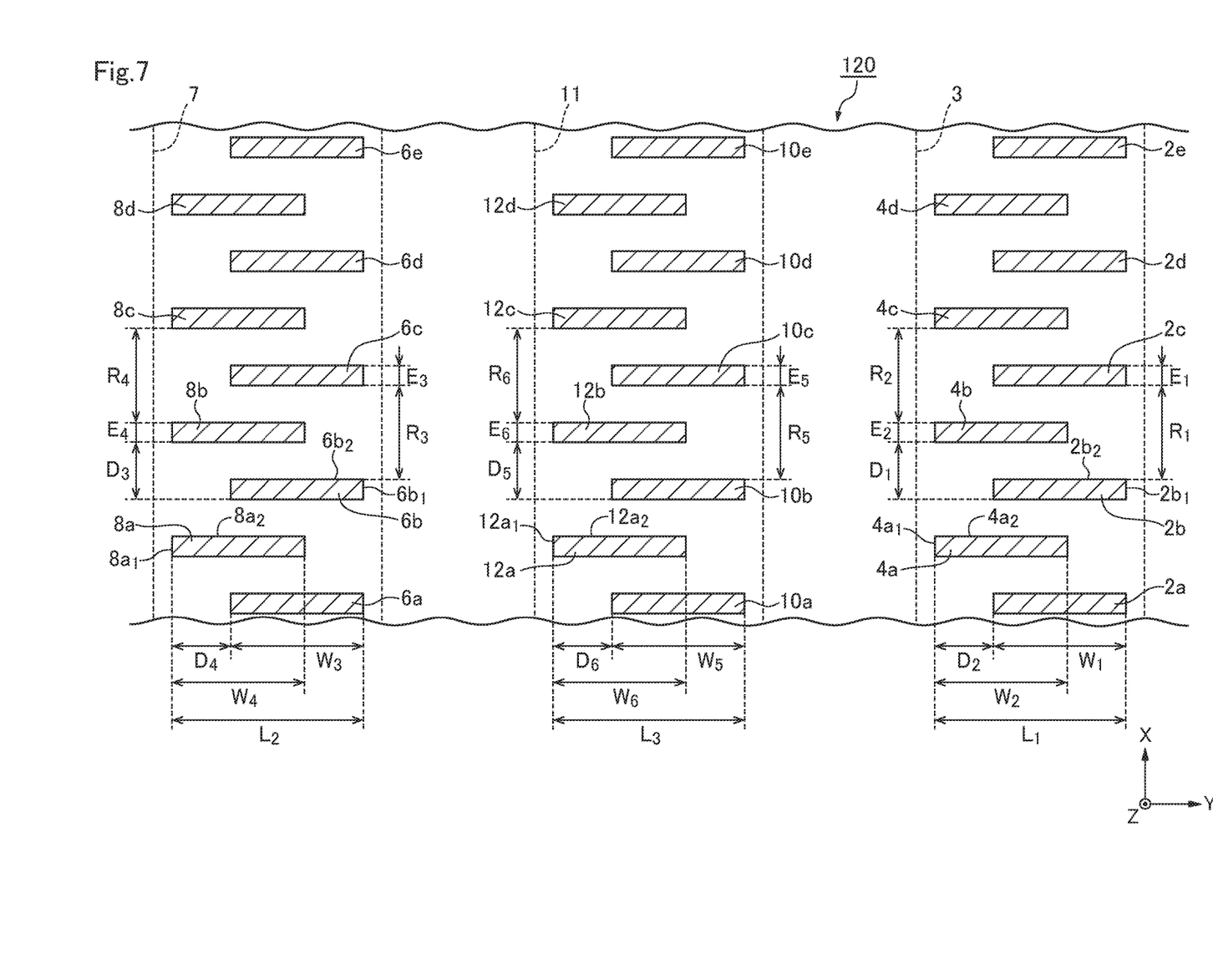
FIG. 7 is a schematic top view of a main section of a semiconductor device according to another aspect of the second embodiment.

FIG. 7 is a schematic cross-sectional view of a main section of a semiconductor device 120 according to another aspect of this embodiment. The semiconductor device 120 is different from the semiconductor device 110 in that $D_2$ is smaller than $W_2$, $D_4$ is smaller than $W_4$, and $D_6$ is smaller than $W_6$. In this case, taking a single first drain electrode $2a$ as an example, a contact portion on a first plane $P_1$ increases by $2 \times (W_2 - D_2)$. Therefore, it is possible to provide a lower-resistance semiconductor device.

The semiconductor device according to this embodiment also enables a low-resistance semiconductor device to be achieved.

Third Embodiment

A semiconductor device of this embodiment is different from the semiconductor devices in the first and the second embodiment in that $E_1$ is larger than $R_1$, $D_1$ is larger than $R_1$, $E_2$ is larger than $R_2$, $E_3$ is larger than $R_3$, $D_3$ is larger than $R_3$, $E_4$ is larger than $R_4$, $E_5$ is larger than $R_5$, $D_5$ is larger than $R_5$, and $E_6$ is larger than $R_6$. Here, those different from the first and the second embodiments will not be described.

Figure 8:
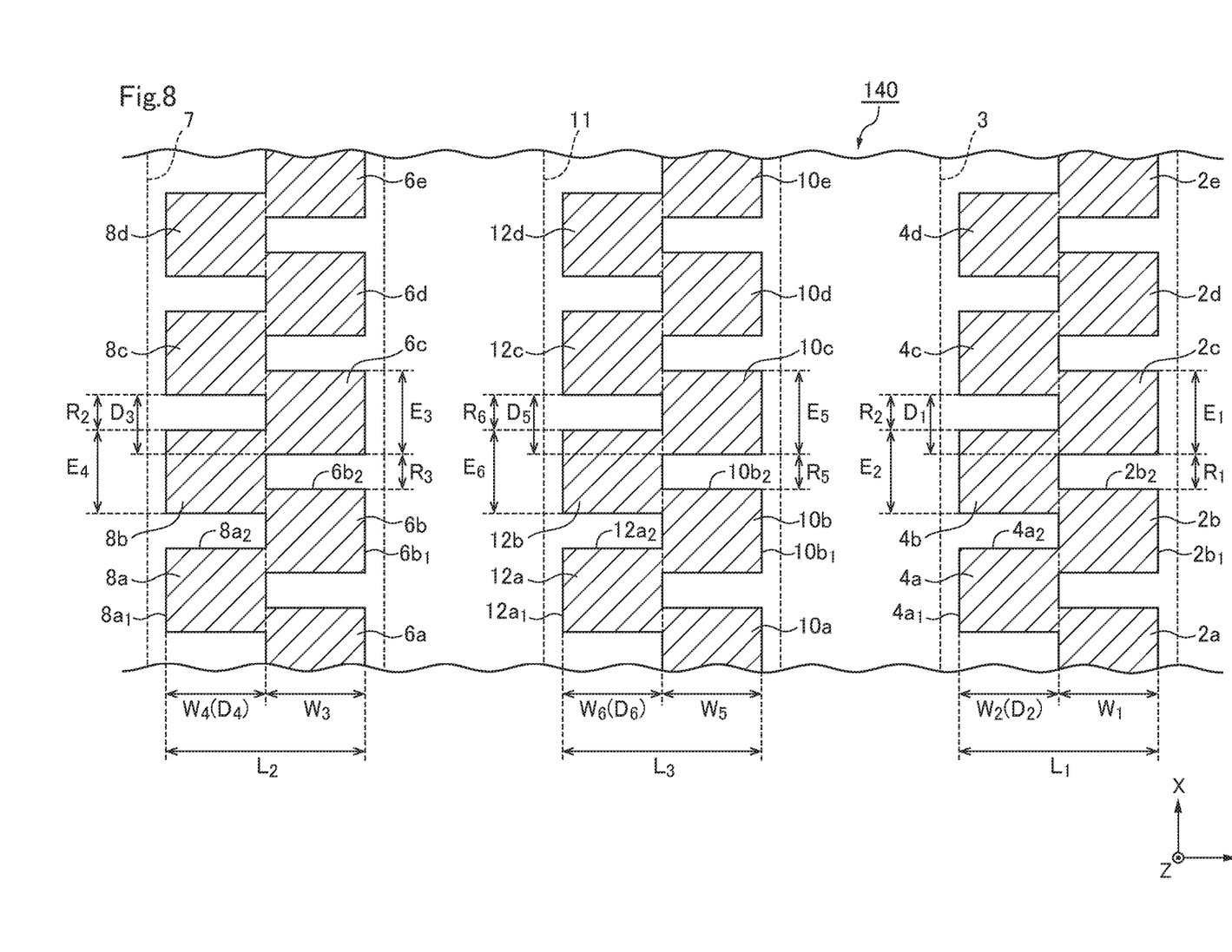
FIG. 8 is a schematic top view of a main section of a semiconductor device according to a third embodiment.

FIG. 8 is a schematic cross-sectional view of a main section of a semiconductor device 140 according to this embodiment. The semiconductor device according to this embodiment also enables a low-resistance semiconductor device to be achieved.

Figure 9:
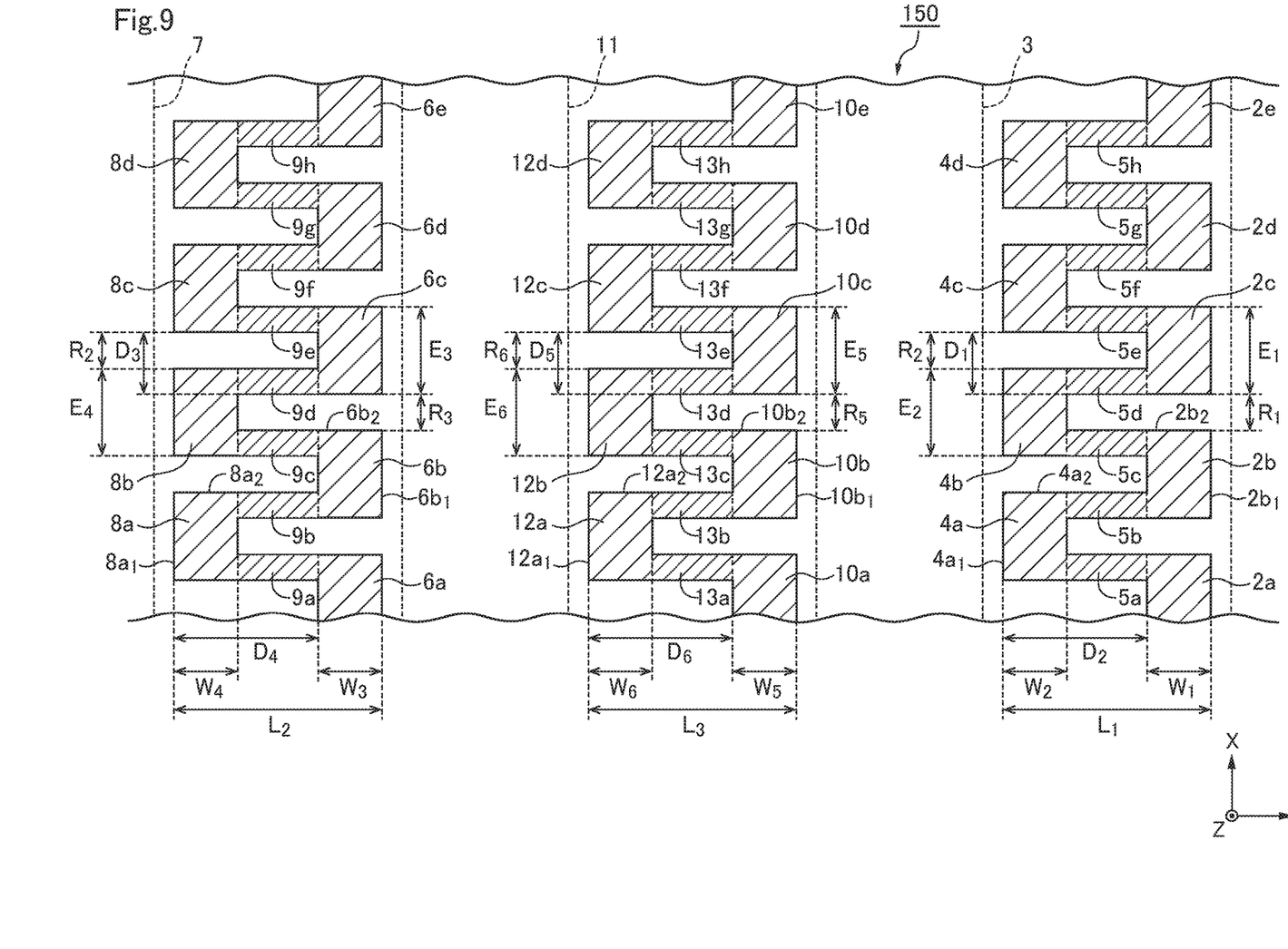
FIG. 9 is a schematic top view of a main section of a semiconductor device according to another aspect of the third embodiment.

FIG. 9 is a schematic cross-sectional view of a main section of a semiconductor device 150 according to another aspect of this embodiment. The semiconductor device 150 is different form the semiconductor device 140 in that $D_2$ is larger than $W_2$, $D_4$ is larger than $W_4$, and $D_6$ is larger than $W_6$. First drain electrodes 2 are electrically connected to second drain electrodes 4 by connection electrodes 5 (an example of the first connection electrodes). In FIG. 9, connection electrodes 5a, 5b, 5c, 5d, 5e, 5f, 5g and 5h are provided as the connection electrodes 5. Third drain electrodes 6 are electrically connected to fourth drain electrodes 8 by connection electrodes 9 (an example of the second connection electrodes). In FIG. 9, connection electrodes 9a, 9b, 9c, 9d, 9e, 9f, 9g, and 9h are provided as the connection electrodes 9. First source electrodes 10 are electrically connected to second source electrodes 12 by connection electrodes 13 (an example of the third connection electrodes). In FIG. 9, connection electrodes 13a, 13b, 13c, 13d, 13e, 13f, 13g, and 13h are provided as the connection electrodes 13.

The semiconductor device according to this embodiment also enables a low-resistance semiconductor device to be achieved.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first nitride semiconductor layer;
a second nitride semiconductor layer provided on the first nitride semiconductor layer and having a bandgap larger than a bandgap of the first nitride semiconductor layer;
a nitride insulating layer provided between the first nitride semiconductor layer and the second nitride semiconductor layer;
a plurality of first drain electrodes each having a part provided on the nitride insulating layer and a part provided beneath the nitride insulating layer;
a plurality of second drain electrodes each having a part provided on the nitride insulating layer and a part provided beneath the nitride insulating layer;
a plurality of third drain electrodes each having a part provided on the nitride insulating layer and a part provided beneath the nitride insulating layer;
a plurality of fourth drain electrodes each having a part provided on the nitride insulating layer and a part provided beneath the nitride insulating layer;
a plurality of first source electrodes provided between the first drain electrodes and the third drain electrodes, the first source electrodes each having a part provided on the nitride insulating layer and a part provided beneath the nitride insulating layer; and
a plurality of second source electrodes provided between the first drain electrodes and the third drain electrodes, the second source electrodes each having a part provided on the nitride insulating layer and a part provided beneath the nitride insulating layer,
wherein the first drain electrodes are separated from each other by a first distance in a first direction parallel to an interface between the first nitride semiconductor layer and the nitride insulating layer,
the second drain electrodes are separated from each other by a second distance in the first direction and positioned from the first drain electrodes by a third distance in the first direction and positioned from the first drain electrodes by a fourth distance in a second direction intersecting with the first direction and parallel to the interface and electrically connected to the first drain electrodes,
the third drain electrodes are separated from each other by a fifth distance in the first direction and separated from the first drain electrodes and the second drain electrodes in the second direction,
the fourth drain electrodes are separated from each other by a sixth distance in the first direction and positioned from the third drain electrodes by a seventh distance in the first direction and positioned from the third drain electrodes by an eighth distance in the second direction and separated from the first drain electrodes and the second drain electrodes and electrically connected to the third drain electrodes,
the first source electrodes are separated from each other by a ninth distance in the first direction, and
the second source electrodes are separated from each other by a tenth distance in the first direction and positioned from the first source electrodes by an eleventh distance in the first direction and positioned from the first source electrodes by a twelfth distance in the second direction and electrically connected to the first source electrodes.

2. The semiconductor device according to claim 1,
wherein the first drain electrodes have a rectangular shape having a first side parallel to the first direction and a second side parallel to the second direction in a predetermined plane parallel to the interface and provided beneath the interface,
the second drain electrodes have a rectangular shape having a third side parallel to the first direction and a fourth side parallel to the second direction in the predetermined plane,
the third drain electrodes have a rectangular shape having a fifth side parallel to the first direction and a sixth side parallel to the second direction in the predetermined plane,
the fourth drain electrodes have a rectangular shape having a seventh side parallel to the first direction and an eighth side parallel to the second direction in the predetermined plane,
the first source electrodes have a rectangular shape having a ninth side parallel to the first direction and a tenth side parallel to the second direction in the predetermined plane, and the second source electrodes have a rectangular shape having an eleventh side parallel to the first direction and a twelfth side parallel to the second direction in the predetermined plane.

3. The semiconductor device according to claim 2, wherein the first side and the third side have a length equal to the first distance, and
the third distance is equal to the first distance.

4. The semiconductor device according to claim 3, wherein the fifth side and the seventh side have a length equal to the fifth distance,
the seventh distance is equal to the fifth distance,
the ninth side and the eleventh side have a length equal to the ninth distance, and
the eleventh distance is equal to the ninth distance.

5. The semiconductor device according to claim 3, wherein the second side and the fourth side have a length equal to the fourth distance,
the sixth side and the eighth side have a length equal to the eighth distance, and
the tenth side and the twelfth side have a length equal to the twelfth distance.

6. The semiconductor device according to claim 2, wherein the first side and the third side have a length shorter than the first distance.

7. The semiconductor device according to claim 6, wherein the fifth side and the seventh side have a length shorter than the fifth distance, and
the ninth side and the eleventh side have a length shorter than the ninth distance.

8. The semiconductor device according to claim 7, wherein the second side and the fourth side have a length equal to the fourth distance,
the sixth side and the eighth side have a length equal to the eighth distance, and
the tenth side and the twelfth side have a length equal to the twelfth distance.

9. The semiconductor device according to claim 7, wherein the second side and the fourth side have a length longer than the fourth distance,
the sixth side and the eighth side have a length longer than the eighth distance, and
the tenth side and the twelfth side have a length longer than the twelfth distance.

10. The semiconductor device according to claim 2, wherein the first side and the third side have a length longer than the first distance.

11. The semiconductor device according to claim 10, wherein the fifth side and the seventh side have a length longer than the fifth distance, and
the ninth side and the eleventh side have a length longer than the ninth distance.

12. The semiconductor device according to claim 11, wherein the second side and the fourth side have a length equal to the fourth distance,
the sixth side and the eighth side have a length equal to the eighth distance, and
the tenth side and the twelfth side have a length equal to the twelfth distance.

13. The semiconductor device according to claim 11, wherein the second side and the fourth side have a length shorter than the fourth distance,
the sixth side and the eighth side have a length shorter than the eighth distance,
the tenth side and the twelfth side have a length shorter than the twelfth distance, and
the semiconductor device further comprises:

a plurality of first connection electrodes configured to connect the first drain electrodes and the second drain electrodes in the predetermined plane;
a plurality of second connection electrodes configured to connect the third drain electrodes and the fourth drain electrodes in the predetermined plane; and
a plurality of third connection electrodes configured to connect the first source electrodes and the second source electrodes in the predetermined plane.

14. A semiconductor device comprising:
a first nitride semiconductor layer;
a second nitride semiconductor layer provided on the first nitride semiconductor layer and having a bandgap larger than a bandgap of the first nitride semiconductor layer;
a nitride insulating layer provided between the first nitride semiconductor layer and the second nitride semiconductor layer;
a plurality of first drain electrodes each having a part provided on the nitride insulating layer and a part provided beneath the nitride insulating layer;
a plurality of second drain electrodes each having a part provided on the nitride insulating layer and a part provided beneath the nitride insulating layer;
a plurality of first source electrodes provided between the first drain electrodes and the third drain electrodes, the first source electrodes each having a part provided on the nitride insulating layer and a part provided beneath the nitride insulating layer; and
a plurality of second source electrodes provided between the first drain electrodes and the third drain electrodes, the second source electrodes each having a part provided on the nitride insulating layer and a part provided beneath the nitride insulating layer,
wherein the first drain electrodes are separated from each other by a shorter width of the second drain electrode in a first direction parallel to an interface between the first nitride semiconductor layer and the nitride insulating layer,
the second drain electrodes are separated from each other by a shorter width of the first drain electrode in the first direction and positioned from the first drain electrodes in the first direction and positioned from the first drain electrodes by a longer width of the first drain electrode in a second direction intersecting with the first direction,
the first source electrodes are separated from each other by a shorter width of the second source electrode in the first direction, and
the second source electrodes are separated from each other by a shorter width of the first source electrode in the first direction and positioned from the first source electrodes by a longer width of the first source in the second direction.

15. The semiconductor device according to claim 14, further comprising,
a plurality of third drain electrodes each having a part provided on the nitride insulating layer and a part provided beneath the nitride insulating layer;
a plurality of fourth drain electrodes each having a part provided on the nitride insulating layer and a part provided beneath the nitride insulating layer; and
wherein the third drain electrodes are separated from each other by a shorter width of the fourth drain electrode in the first direction,
the fourth drain electrodes are separated from each other by a shorter width of the third drain electrode in the first direction and respectively positioned from the third drain electrodes in the first direction and positioned from the first third electrodes by a longer width of the first drain electrode in the second direction.

16. The semiconductor device according to claim 15, wherein the first source electrodes and the second source electrodes are positioned between the second drain electrodes and the third drain electrodes.

17. The semiconductor device according to claim 16, wherein the second drain electrodes and the third drain electrodes are positioned between the first drain electrodes and the fourth drain electrodes.

* * * * *